United States Patent [19]

Ikeda et al.

[11] Patent Number: 4,783,358
[45] Date of Patent: Nov. 8, 1988

[54] CERAMIC WIRING SUBSTRATE

[75] Inventors: Teruyuki Ikeda; Kazuaki Utsumi, both of Tokyo, Japan

[73] Assignee: NEC Corporation, Japan

[21] Appl. No.: 13,018

[22] Filed: Feb. 10, 1987

[30] Foreign Application Priority Data

Feb. 14, 1986 [JP] Japan ................................. 61-31184

[51] Int. Cl.[4] .............................. B32B 3/10; B32B 3/00
[52] U.S. Cl. ..................................... 428/138; 428/137; 428/210; 428/901
[58] Field of Search .................. 156/89, 155; 428/137, 428/138, 901, 210

[56] References Cited

U.S. PATENT DOCUMENTS

| 4,488,920 | 12/1984 | Danis ................................. | 156/155 |
| 4,610,741 | 9/1986 | Mase et al. ........................... | 156/89 |

FOREIGN PATENT DOCUMENTS

| 0728587 | 2/1966 | Canada ................................. | 156/89 |
| 0014980 | 7/1969 | Japan ................................... | 156/155 |
| 0003270 | 1/1979 | Japan ................................... | 156/89 |
| 0002209 | 2/1979 | Japan ................................... | 156/89 |

OTHER PUBLICATIONS

IEEE Transactions on Components, Hybrids, and Manufacturing Technology, vol. CHMT-6, No. 4, Dec. 1983, "Low Firing Temperature Multilayer Glass-Ceramic Substrate", by Yuzo Shimada et al.

Primary Examiner—John E. Kittle
Assistant Examiner—P. J. Ryan
Attorney, Agent, or Firm—Laff, Whitesel, Conte & Saret

[57] ABSTRACT

A ceramic wiring substrate has at least one layer of a signal line pattern, a ground electrode pattern layer, and a cavity formed by a region which covers part of or completely the signal line pattern inside ceramic between the signal line pattern and the ground electrode pattern.

5 Claims, 4 Drawing Sheets

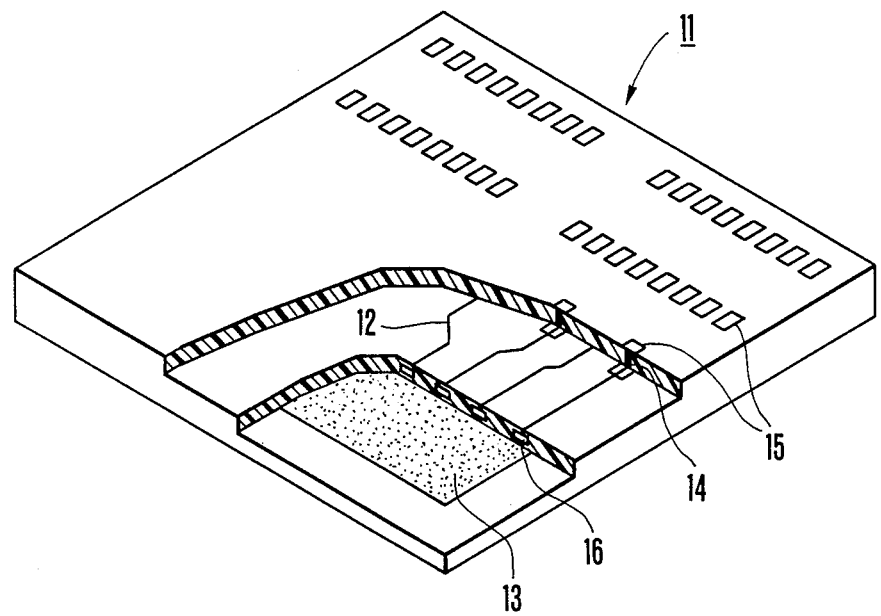
F I G. 1
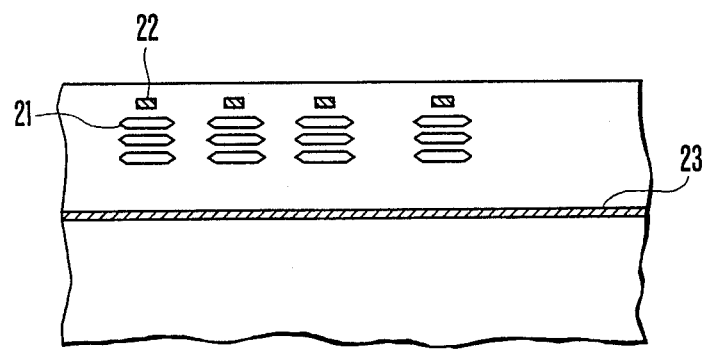
F I G. 2

CERAMIC WIRING SUBSTRATE

BACKGROUND OF THE INVENTION

The present invention relates to a ceramic wiring substrate.

Recently, a multilayer wiring substrate has been put into practical use for high performance of a computer. In the multilayer wiring substrate, wiring is multilayered, wiring lengths between LSI elements such as a logic gate or a memory mounted to the substrate and between the LSI elements and a power source and a ground electrode are shortened to reduce delay time of transfer of a signal, thereby obtaining a high speed operation of the computer.

In the multilayer substrate, the lower the permittivity of a substrate material, the better. The reason for this is as follows. In order to constitute a memory module which packages many memory chips, many memory chips must be connected in parallel, so that signal lines are elongated. As a result, a capacitance relative to ground of a signal line formed between the signal line and a ground electrode is increased. As a result, a load capacitance of a drive element for driving a memory element is increased, and a rise time of a signal is increased, thereby adversely affecting an access time. For this reason, a portion which forms a signal line of the substrate preferably has a low permittivity, and efforts have been made to obtain a low permittivity of the substrate material. However, to obtain a low permittivity is not easy because the permittivity of the substrate conflicts with mechanical characteristics such as strength and thermal characteristics such as a sintering temperature or a thermal expansion coefficient.

A method of obtaining a multilayer substrate with a low permittivity by a low sintering temperature is disclosed in an article entitled "Low Firing Temperature Multilayer Glass-Ceramic Substrate" which is announced in IFFE TRANSACTION ON COMPONENTS, HYBRIDS, AND MANUFACTURING TECHNOLOGY, VOL. CHMT-6, No. 4 DECEMBER 1983 pp. 382–388. According to this method, a multilayer wiring substrate is realized using glass-ceramic which can be sintered at a low temperature of 900° C. and has a permittivity of 7.5.

However, the permittivity of the above value is insufficient.

SUMMARY OF THE INVENTION

It is an object of the present invention to provide a multilayer wiring substrate capable of realizing a low permittivity without considering the mechanical and thermal characteristics of a material.

A ceramic wiring substrate according to the present invention has at least one signal line pattern and a ground electrode pattern and also has a cavity which is formed inside the ceramic between the signal line pattern and the ground electrode pattern and which includes a region which covers part of or completely the signal line pattern.

BRIEF DESCRIPTION OF THE DRAWINGS

FIG. 1 is a partially cut away perspective view of a ceramic wiring substrate;

FIG. 2 is a sectional view of a ceramic wiring substrate having cavities formed in a plurality of layers;

DETAILED DESCRIPTION OF THE PREFERRED EMBODIMENTS

Figure 3:
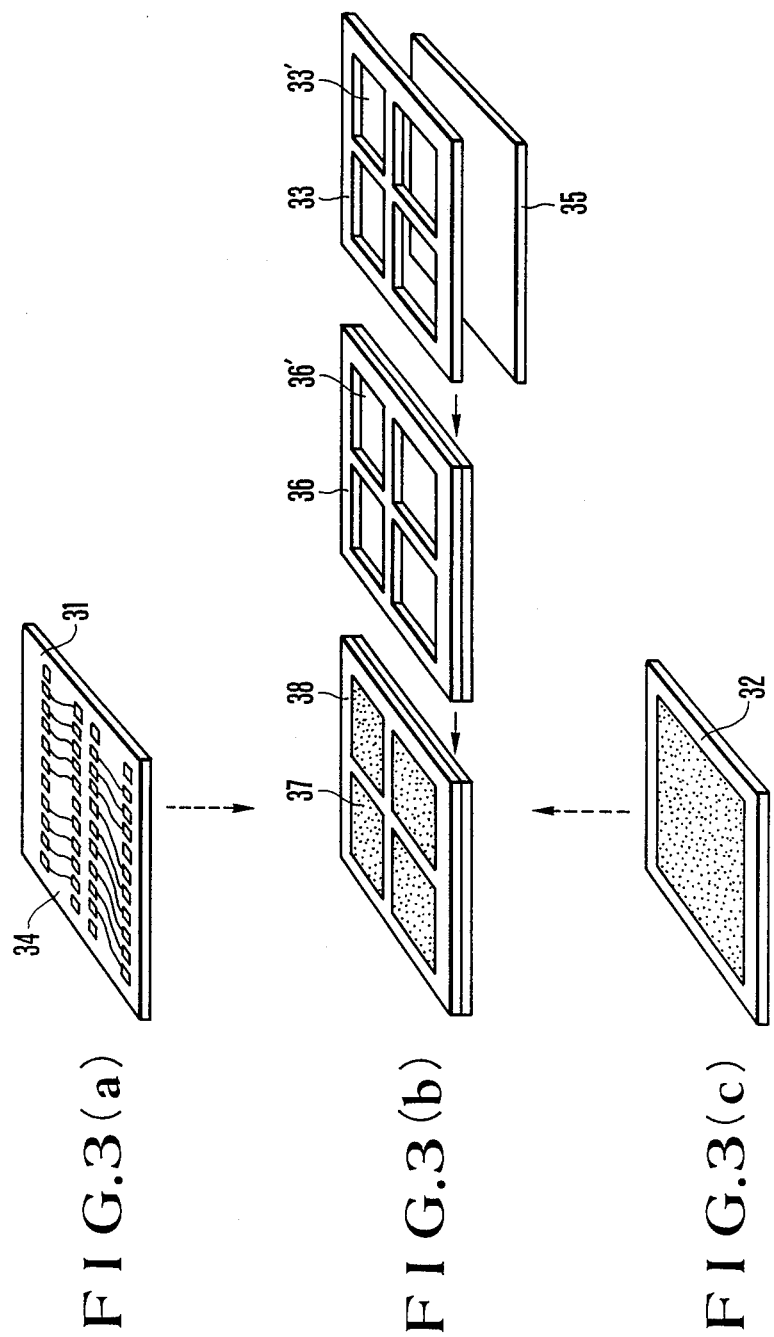
FIGS. 3(a) to 3(c) are perspective views for explaining a method of manufacturing the ceramic wiring substrate of the present invention.
Figure 4:
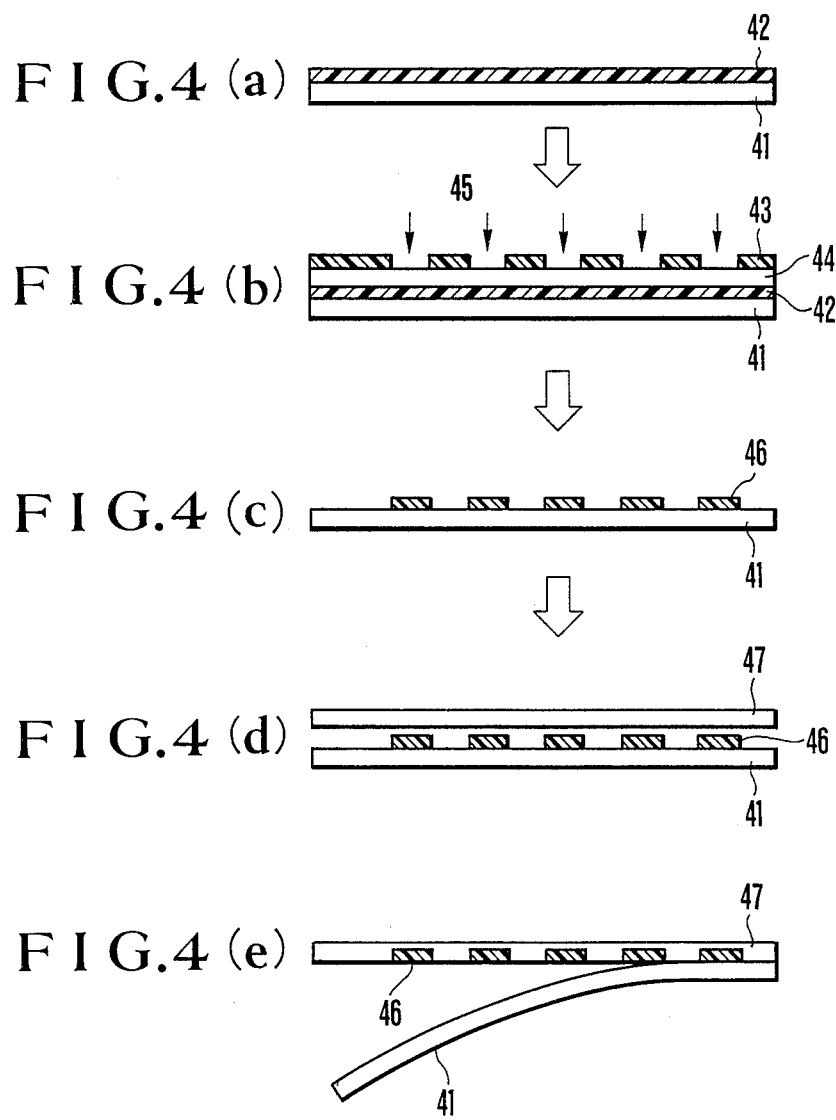
FIG. 4 is a sectional view for explaining another method of manufacturing the ceramic wiring substrate of the present invention.

A ceramic wiring substrate of the present invention will now be described below with reference to the accompanying drawings.

FIG. 1 is a partially cut away perspective view of a ceramic wiring substrate 11 of the present invention, in which a signal wiring pattern 12 and a ground electrode (may be a power source electrode) 13 are formed inside a ceramic substrate 11 and connected to a chip connecting pad 15 on the upper surface of the substrate 11 by a via hole 14. A cavity 16 is formed between the signal wiring pattern 12 and the ground electrode 13 and is parallel to the signal wiring pattern 12. By the cavity 16 formed between the signal wiring pattern 12 and the ground electrode 13, a capacitance therebetween can be reduced. If the substrate 11 is used in air, it can be assumed that the interior of the cavity 16 is substantially the air. Permittivity of air is substantially 1, and this means that a layer of a low permittivity is formed between the signal wiring pattern 12 and the ground electrode 13. Assuming that a capacitance between the signal wiring pattern 12 and the ground electrode 13 is $C_0$, the capacitance $C_0$ is a series circuit of a capacitance $C_1$ of the cavity 16 and a capacitance $C_2$ of a ceramic portion. Assuming that a permittivity and a thickness of the cavity 16 are $\epsilon_{r1}$ and $t_1$, respectively, that a permittivity and a thickness of the ceramic portion are $\epsilon_{r2}$ and $t_2$, respectively, and that the opposing area of the cavity and the ceramic poriton is A, $$C_0 = \epsilon_0 \cdot A / (t_1/\epsilon_{r1} + t_2/\epsilon_{r2}) \tag{1}$$

Substitution of 1 in $\epsilon_{r1}$ of the cavity 16 yields, $$C_0 = \epsilon_0 \cdot A / (t_1 + t_2/\epsilon_{r2}) \tag{2}$$

Therefore, it is found that when the thickness of the cavity 16 is increased with respect to that of an insulator portion between the signal wiring pattern 12 and the ground electrode 13, the capacitance $C_0$ can be reduced. When the effective permittivity of the ceramic wiring substrate obtained in the manner as described above is calculated from a capacitance assuming that there is no cavity, it is equivalent to 50 to 80% reduction in permittivity of the substrate material.

On the contrary, forming the cavity 16 in the substrate 11 weakens the strength of the substrate 11. However, since the cavity 16 is formed immediately below the signal wiring pattern 12 and need only be slightly wider than a width of the signal wiring pattern 12, a percentage of the cavity 16 with respect to the substrate 11 is small, and the flexural strength of the substrate 11 is degraded only by 2 to 3% (which varies in accordance with an area ratio of the cavity pattern and the ceramic portion). Thus, practically no problem is posed.

The ceramic wiring substrate 1 described above is manufactured by the following steps.

First, a mixture powder is prepared such that the amounts of a crystalline glass powder and an aluminum oxide are selected in the ranges of 40 to 60 wt. % and 60 to 40 wt. %, respectively, to obtain a total amount of 100%. The powder is mixed with a binder, organic solvent, and plasticizer to make a slurry, and a 20 to 300 μm-thick green sheet is formed on a polyester film by a slip casting film formation method such as a doctor blade method and is then removed. Then, the signal wiring pattern 12 and a pattern of the ground electrode 13 are formed on a plurality of such green sheets using a screen printer. A pattern of the cavity 16 is printed and formed in the same manner using a paste such as carbon which is decomposed and scattered before the sintering temperature of the above ceramic green sheet is reached. The pattern of the cavity 16 may be formed by pressing a film patterned by exposing and developing a photosensitive resin.

Green sheets to each of which the signal wiring pattern 12, the pattern of the ground electrode 13, and the pattern of the cavity 16 are formed are stacked, heated at a temperature of about 100° C., and then pressed at a pressure of about 250 kg/cm² to obtain a stacking body. Then, after the stacking body is cut in a predetermined size as needed, organic materials present in the pattern of the cavity 16 or the ceramic green sheet are gradually heated in an oxidizing atmosphere in a binder separation step to be decomposed and removed. Normally, these organic materials are completely decomposed and oxidized at 500° to 600° C. However, if a temperature is rapidly increased to the decomposition temperature, the stacking body is damaged. Therefore, the temperature is increased at a rate of 25° C./hour or less to maintain a temperature of 500° to 600° C. for a long period of time so that the organic materials can be completely removed. Since no organic material remains in the stacking body after the binder separation step, the cavity pattern portion is formed as the cavity 16 in the stacking body. Thereafter, the resultant material is sintered at 800° to 1,000° C. to obtain the ceramic wiring substrate 11 having the cavity between the signal wiring pattern 12 and the ground electrode 13.

In the above method of printing a carbon paste to form the cavity pattern, a thickness of the paste obtained by one printing is 10 to 15 μm. Therefore, only a cavity having a thickness of about 10 μm can be obtained when the paste is printed onto a single layer sheet, so that formation of the cavity 16 results in little effect on reducing the capacitance between the signal wiring pattern 12 and the ground electrode 13. For this reason, the cavity patterns are formed in a plurality of layers. FIG. 2 is a sectional view showing this case. In FIG. 2, since cavities 21 formed in a plurality of layers are present between a signal circuit electrode 22 and a ground electrode 23, a ratio of the thickness of the cavity with respect to the thickness of a dielectric between the signal circuit electrode 22 and the ground electrode 23 can be increased even if the thickness of the cavity in a single layer is small. Therefore, similar to the case of increasing the thickness of the cavity, a capacitance between the signal circuit electrode 22 and the ground electrode 23 can be reduced.

For example, assuming that a pattern area of the signal circuit electrode 22 is 25 mm², that an interval constituted by five layers of green sheets between the signal circuit 22 and the ground electrode 23 is 410 μm, and that a permittivity of an insulator is $\epsilon_r = 8$, values shown in Table 1 are obtained by calculating $C_0$ from a relationship between thicknesses of the insulator and the cavity and calculating an effective permittivity from $C_0$.

In addition, Table 2 shows an effect when the permittivity of the insulating portion of the substrate is 15. As shown in Tables 1 and 2, when a cavity is formed in the insulator between the signal circuit and the ground electrode, the capacitance therebetween is reduced, and hence the effective permittivity obtained from the capacitance is reduced. Furthermore, it is found that the higher the permittivity of the insulator portion is, the greater the permittivity reduction effect by the cavity is. Formation of a cavity having a thickness of 50 to 100 μm provides a permittivity reduction of 50 to 80%.

TABLE 1

| Thickness of Cavity (μm) | Thickness of Insulator (μm) | Capacitance Relative to Ground $C_0$ (pF) | Effective Permittivity |
|---|---|---|---|
| 0 | 410 | 4.3 | 8 |
| 10 | 400 | 3.7 | 6.9 |
| 20 | 390 | 3.2 | 6.0 |
| 50 | 360 | 2.3 | 4.3 |
| 100 | 310 | 1.6 | 3.0 |
| 200 | 210 | 1.0 | 1.8 |
| 300 | 110 | 0.7 | 1.3 |
| 400 | 10 | 0.6 | 1.02 |
| 410 | 0 | 0.5 | 1 |

TABLE 2

| Thickness of Cavity (μm) | Thickness of Insulator (μm) | Capacitance Relative to Ground $C_0$ (pF) | Effective Permittivity |
|---|---|---|---|
| 0 | 410 | 8.1 | 15 |
| 10 | 400 | 6.0 | 11.2 |
| 20 | 390 | 4.8 | 8.9 |
| 50 | 360 | 3.0 | 5.6 |
| 100 | 310 | 1.8 | 3.4 |
| 200 | 210 | 1.0 | 1.9 |
| 300 | 110 | 0.7 | 1.3 |
| 400 | 10 | 0.55 | 1.01 |
| 410 | 0 | 0.54 | 1 |

FIGS. 3(a) to 3(c) show another method of forming a cavity. Hole 33' is opened by a punching method at a portion, immediately below a portion where signal patterns 34 of a signal circuit pattern layer 31 are concentrated, in a sheet 33 for forming a cavity between the signal circuit pattern 31 and a ground electrode 32. The sheet 33 with the hole 33' is adhered to a sheet 35 without a hole to obtain a composite sheet 36 having a groove 36' in one layer. Then, using a screen printer, a carbon paste 37 is buried in the groove 36' of the composite sheet 36 to obtain a composite sheet 38 in which the carbon paste is buried in one layer. Then, a signal circuit pattern 34, the composite sheet 38, and a ground electrode 32 are stacked and then subjected to a binder separation sintering step to obtain a ceramic wiring substrate with a cavity having a thickness of one layer.

FIGS. 4(a) to 4(e) show a method of forming a cavity pattern using a photosensitive resin. Photosensitive resin 42 is coated uniformly on a carrier film 41 such as a polyester to a predetermined thickness (FIG. 4(a)). Then, a photo mask 44 to which a predetermined pattern 43 is formed is brought into contact with the photosensitive resin sheet, exposed by radiation of light 45, and then subjected to a development treatment to obtain a predetermined cavity pattern 46 (FIGS. 4(b) and 4(c)). The cavity pattern 46 thus obtained is pressed against a ceramic green sheet 47 and is transferred (FIG. 4(d)), and then the carrier film 41 is removed (FIG. 4(e)). The ceramic green sheet 47 thus obtained is sandwiched between the sheets of the signal wiring pattern and the ground electrode, and then the composite body is put into a press die and is pressed.

In this case, the cavity pattern 46 removed from the carrier film 41 may be placed directly on the ceramic green sheet 47. At this time, in order to prevent deviation, the carrier film 41 may be temporarily pressed or fixed by an adhesive or the like. In addition, one of the reasons to use a photosensitive resin is that even a micro pattern can be obtained with high accuracy, and cavities can be easily made along the signal wiring. Therefore, in order to obtain a cavity pattern, having a relatively large area, in which portions where the signal patterns are concentrated are integrated, no photosensitive resin need be used. In this case, a resin sheet which is gasified and removed in the sintering step may be simply punched and pressed on the green sheet.

An example of a substrate packaging 18 memory chips on both sides will be described below as an embodiment of the present invention.

Figure 5:
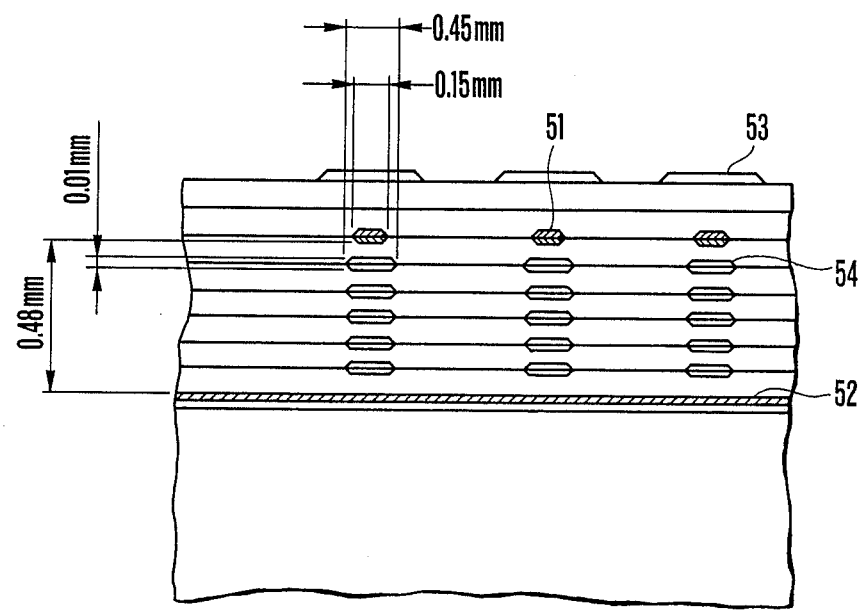
FIG. 5 is a sectional view of the another embodiment of the ceramic wiring substrate of the present invention.

FIG. 5 is a sectional view of one side of a substrate which packages 9 memory chips on one side, i.e., 18 on both sides. In FIG. 5, reference numeral 51 denotes a signal wiring pattern; 52, a ground electrode; 53, a memory chip packaging pad; and 54, a cavity pattern. As described above, most of address and control lines of the memory chips are connected parallel to each other. If no cavity is formed, a capacitance between the signal wiring pattern 51 and the ground electrode 52 is high. In this embodiment, five cavity formation layers are formed between the signal wiring pattern 51 and the ground electrode 52, and a carbon paste is printed and formed to each layer as a cavity pattern. A thickness of the paste during printing is 10 to 15 $\mu$m. Although not shown, five similar cavity formation layers are arranged between the signal wiring pattern and the ground electrode at the side of the chip on the opposite surface of the substrate. A width of the cavity pattern is three times the pattern width of 150 $\mu$m of the signal wiring, i.e., 450 $\mu$m.

At this time, a cavity 54 divided into five layers between the signal wiring pattern 51 and the ground electrode 52 has a thickness of about 10 $\mu$m and 50 $\mu$m for five layers, and a thickness of the insulator portion for six layers is 430 $\mu$m. A capacitance of the signal wiring pattern relative to ground is 24.2 pF, and that in the case in which no cavity is formed is 40.5 pF, so that a capacitance reduction of about 60% is obtained.

As is apparent from the above description, by forming a cavity in a ceramic substrate, a capacitance determined by a dielectric constant, a width of the signal circuit pattern, and an interval between the signal circuit pattern and the ground electrode can be easily reduced. Conventionally, in order to reduce the capacitance, the circuit pattern width is micropatterned or a dielectric constant of a substrate material is reduced. On the contrary, in the present invention, the substrate material need not be changed at all nor the pattern width need be micropatterned.

Since the pattern capacitance can be reduced without changing the material, the present invention can be applied to a packaging substrate for a computer, e.g., a multi-chip package, which requires a high speed operation, thereby improving performance of a computer. In addition, when a material of a signal circuit portion and a high permittivity material which is a material different from that of the signal circuit portion are integrally sintered in the substrate to form a capacitor therein, a dielectric constant of the signal circuit portion is sometimes increased by a reaction of both the materials as compared with the case in which the high permittivity material is not sintered integrally. Also in this case, a cavity is formed in the substrate to reduce the effective permittivity.

Note that in this embodiment, a description has been made with reference to the capacitance relative to ground of a portion between a signal line and the ground electrode. However, the same effect can be obtained with respect to not only the ground electrode but also to the power supply pattern. In addition, when the cavity is formed between the signal patterns, a reduction effect of crosstalk of the signal can be obtained.

What is claimed is:

1. A ceramic wiring substrate comprising:
    a first layer having an electrode formed across an entire upper surface thereof;
    a plurality of layers sequentially stacked on said electrode;
    a plurality of signal lines formed on an upper surface of an uppermost one of said plurality of layers;
    an insulating layer formed on the upper surface of said uppermost layer and said plurality of signal lines;
    a plurality of pads formed on an upper surface of said insulating layer, said plurality of pads being connected to said plurality of signal lines via a plurality of through holes formed in said insulating layer;
    a plurality of cavities formed between each of said plurality of signal lines and said electrode so as to be stacked in a vertical direction, each of said plurality of cavities extending along an entire length of the corresponding one of said plurality of signal lines and having a width in a horizontal direction which is greater than the width of said signal line.

2. The ceramic wiring substrate according to claim 1, wherein each of said plurality of cavities is formed at a boundary between two layers of said plurality of layers.

3. The substrate according to claim 1, wherein the width of said signal line is no more than in the order of 150 $\mu$m, the width of each of said cavities is about three times the width of said signal line and the thickness of each cavity in the order of about 10 $\mu$m, thereby reducing the capacitance relative to ground by about 60% as compared with the capacitance which would exist if no cavity is formed.

4. A ceramic wiring substrate comprising:
    a ceramic layer;
    a plurality of signal lines formed inside said ceramic layer at the same depth as measured from an upper surface of said ceramic layer;
    an electrode formed across an entire lower surface of said ceramic layer;
    a plurality of cavities formed between each of said plurality of signal lines and said electrode so as to be stacked in a vertical direction, each of said plurality of cavities extending along an entire length of a corresponding one of said plurality of signal lines and having a width in a horizontal direction which is larger than the width of the corresponding one of said plurality of signal lines.

5. A ceramic wiring substrate for mounting a plurality of parts on an upper surface thereof comprising:
    an uppermost ceramic layer having an upper surface on which are formed a plurality of pads adapted to be connected to said plurality of parts, and a plurality of through holes formed in said uppermost ceramic layer and under said plurality pads in a one to one correspondence;

a plurality of signal lines formed on a lower surface of said uppermost ceramic layer, said plurality of signal lines being connected with said plurality of pads via said plurality of through holes;

an intermediate ceramic layer formed on the lower surface of said uppermost layer and said a plurality of signal lines;

a plurality of cavities formed inside said intermediate ceramic layer so as to correspond to said plurality of signal lines, each of said plurality of cavities being continuously formed directly under and along an entire length of the corresponding one of said plurality of signal lines, each of said cavities having a width in a horizontal direction which is larger than the width of the corresponding one of said plurality of signal lines; and an electrode formed across an entire lower surface of said intermediate ceramic layer.

* * * * *